United States Patent
Roberts

(10) Patent No.: US 10,515,671 B2
(45) Date of Patent: Dec. 24, 2019

(54) METHOD AND APPARATUS FOR REDUCING MEMORY ACCESS LATENCY

(71) Applicant: Advanced Micro Devices, Inc., Sunnyvale, CA (US)

(72) Inventor: David A. Roberts, Sunnyvale, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 112 days.

(21) Appl. No.: 15/272,894

(22) Filed: Sep. 22, 2016

(65) Prior Publication Data

US 2018/0081563 A1    Mar. 22, 2018

(51) Int. Cl.
    G11C 7/00    (2006.01)
    G11C 7/22    (2006.01)
    G11C 29/04   (2006.01)

(52) U.S. Cl.
    CPC ............ G11C 7/00 (2013.01); G11C 7/222 (2013.01); *G11C 2029/0409* (2013.01)

(58) Field of Classification Search
    None
    See application file for complete search history.

(56) References Cited

U.S. PATENT DOCUMENTS

| 5,487,160 | A  | 1/1996  | Bemis         |
|-----------|----|---------|---------------|
| 5,535,381 | A  | 7/1996  | Kopper        |
| 5,893,155 | A  | 4/1999  | Cheriton      |
| 6,182,198 | B1 | 1/2001  | Hubis et al.  |
| 6,243,315 | B1 | 6/2001  | Goodman       |
| 6,434,681 | B1 | 8/2002  | Armangau      |
| 6,438,660 | B1 | 8/2002  | Beams         |
| 6,442,666 | B1 | 8/2002  | Stracovsky    |
| 6,564,329 | B1 | 5/2003  | Cheung et al. |
| 6,691,245 | B1 | 2/2004  | DeKoning      |
| 6,701,455 | B1 | 3/2004  | Yamamoto et al. |
| 6,789,153 | B1 | 9/2004  | Stewart       |
| 7,085,900 | B2 | 8/2006  | Inagaki et al. |
| 7,100,013 | B1 | 8/2006  | de Waal       |
| RE39,963  | E  | 12/2007 | Cheung et al. |
| 7,590,885 | B2 | 9/2009  | Kondo et al.  |

(Continued)

FOREIGN PATENT DOCUMENTS

WO    2007/024937 A1    3/2007

OTHER PUBLICATIONS

Extended Search Report dated Apr. 8, 2013 from the EPO in related application No. 09832785.1.

(Continued)

*Primary Examiner* — Yaima Rigol
(74) *Attorney, Agent, or Firm* — Faegre Baker Daniels LLP

(57) ABSTRACT

Logic such as a memory controller writes primary data from an incoming write request as well as corresponding replicated primary data (which is a copy of the primary data) to one or more different memory banks of random access memory in response to determining a memory access contention condition for the address (including a range of addresses) corresponding to the incoming write request. When the memory bank containing the primary data is busy servicing a write request, such as to another row of memory in the bank, a read request for the primary data is serviced by reading the replicated primary data from the different memory bank of the random access memory to service the incoming read request.

21 Claims, 6 Drawing Sheets

(56) References Cited

U.S. PATENT DOCUMENTS

| | | |
|---|---|---|
| 2002/0069328 A1 | 6/2002 | Chauvel |
| 2002/0194291 A1* | 12/2002 | Najam ................. H04L 49/103 709/213 |
| 2003/0126387 A1 | 7/2003 | Watanabe |
| 2003/0177321 A1 | 9/2003 | Watanabe |
| 2004/0073831 A1 | 4/2004 | Yanai et al. |
| 2004/0103253 A1 | 5/2004 | Kamei et al. |
| 2004/0205309 A1 | 10/2004 | Watanabe |
| 2004/0221127 A1 | 11/2004 | Ang |
| 2004/0268067 A1 | 12/2004 | Yamagami |
| 2005/0132155 A1 | 6/2005 | Kasako |
| 2005/0251776 A1 | 11/2005 | Hsin et al. |
| 2005/0273654 A1 | 12/2005 | Chen et al. |
| 2006/0031646 A1 | 2/2006 | Maruyama et al. |
| 2006/0149903 A1 | 7/2006 | Sugimoto |
| 2006/0184846 A1* | 8/2006 | Hillier, III .......... G06F 11/1666 714/718 |
| 2006/0236049 A1 | 10/2006 | Iwamura |
| 2007/0028144 A1 | 2/2007 | Graham et al. |
| 2007/0055901 A1 | 3/2007 | Van Der Heijden |
| 2007/0061616 A1 | 3/2007 | Watanabe |
| 2007/0113044 A1 | 5/2007 | Day et al. |
| 2007/0174584 A1 | 7/2007 | Kopec et al. |
| 2007/0239934 A1 | 10/2007 | Watanabe |
| 2008/0028144 A1 | 1/2008 | Sutoh et al. |
| 2008/0177964 A1 | 7/2008 | Takahashi et al. |
| 2008/0313413 A1 | 12/2008 | Hutner et al. |
| 2008/0320260 A1 | 12/2008 | Watanabe |
| 2009/0147021 A1 | 6/2009 | Glen |
| 2010/0121824 A1 | 5/2010 | Kawamura et al. |
| 2010/0205383 A1* | 8/2010 | Blackmon ............... G06F 12/10 711/149 |
| 2010/0241765 A1 | 9/2010 | Chikusa et al. |
| 2010/0332718 A1* | 12/2010 | Farrell ................ G06F 13/1647 711/5 |
| 2013/0151767 A1* | 6/2013 | Berke ................. G06F 11/1048 711/105 |
| 2015/0067216 A1* | 3/2015 | Jarmany ............. G06F 13/1668 710/261 |
| 2017/0315914 A1* | 11/2017 | Muralimanohar .. G06F 12/0804 |
| 2018/0032264 A1* | 2/2018 | Gomez ................... G06F 3/065 |

OTHER PUBLICATIONS

Japanese Office Action dated Feb. 12, 2014 in related Japanese Application No. 2012512468A.

International Search Report and Written Opinion from Canadian Patent Office; International Application No. PCT/CA2009/001855; dated Feb. 9, 2010.

Hennessy, John L.; VLSI Processor Architecture; IEEE Transactions on Computers archive; vol. 33, Issue 12; Dec. 1984.

* cited by examiner

METHOD AND APPARATUS FOR REDUCING MEMORY ACCESS LATENCY

GOVERNMENT LICENSE RIGHTS

This invention was made with government support under Prime Contract Number DE-AC52-07NA27344, Subcontract No. B608045 awarded by the Department of Energy (DOE). The government has certain rights in the invention.

BACKGROUND OF THE DISCLOSURE

Emerging non-volatile random access memories (NVRAM), such as resistive random access memory (ReRAM), phase-change memory (PCM), and spin-transfer torque magnetic random access memory (STT-RAM) and other technologies, have wide applicability in computing systems. Such emerging non-volatile random access memory technologies are replacing existing technologies such as dynamic random access memory (DRAM) and solid state drive (SSD) and can enable additional capabilities in other memory technologies, such as persistent tiers of memory hierarchy. Unlike DRAM, which stores bit information in the form of electric charges, non-volatile random access memory stores the bit information by altering properties (e.g., resistance, physical state, magnetic orientation) of a suitable material in each memory cell.

Non-volatile main memories may have terabytes of capacity on a single device. Memory access latencies for non-volatile random access memories may be higher than volatile memory technologies, especially for write requests. High-latency write requests, for example, can block access to the memory bank that contains the corresponding memory cells, which increases service time of read requests to that same bank, leading to negative impact on performance.

For example, if a memory controller controls eight banks of memory, then eight write requests received from one or more memory access engines may be processed. However, non-volatile memory such as NVRAM may have long write latencies, meaning that it can take longer to effect a write than a read from the same memory bank. Memory latencies may be more important for real time operations such as providing video playback by memory access engines such as graphics processing units (GPUs), central processing units (CPUs), or other processors in the device, such as devices that provide real-time video conferencing, live video playback, or any other high latency data where a user can visually perceive interruptions if the data is not provided to a display or audio output in a timely manner.

Read latencies have been reduced by techniques that, for example, provide a write pausing to allow reads to other rows in a bank that is undergoing a high latency write to the same bank. The write is paused until the read operation is completed. However, such operations can unnecessarily slow down the memory access operation. For example, write requests to a memory bank can be paused by a memory controller while reads to different memory locations in the same bank occur.

As such, writes or reads to internal memory that cause high latency or memory access contention can negatively reduce performance and greatly impact a user experience.

BRIEF DESCRIPTION OF THE DRAWINGS

The disclosure will be more readily understood in view of the following description when accompanied by the below figures and wherein like reference numerals represent like elements, wherein.

DETAILED DESCRIPTION OF EMBODIMENTS

Figure 1:
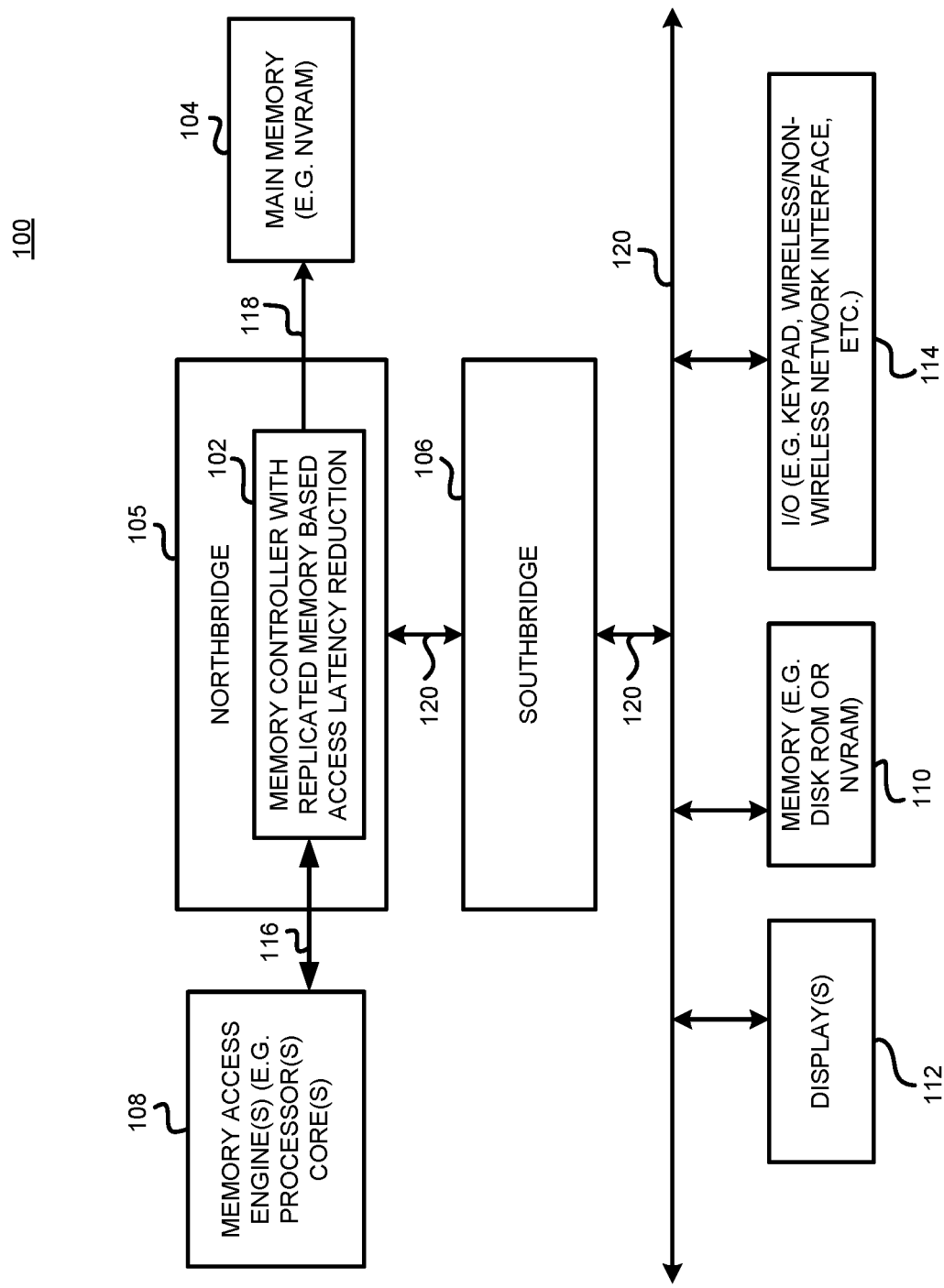
FIG. 1 is a block diagram illustrating one example of an apparatus in accordance with the disclosure.

In one example, a method and apparatus for reducing memory access latency employs groups of random access memory banks, pairs of memory banks in a simple case, where write data from a write request is designated to be replicated in one or more RAM memory banks. The random access memory banks in one example are within a single chip, but can be across multiple chips. In one example, a logical size for replicated primary data is a cache line (the unit size of a read/write request). In another example, the logical size is a row buffer size (unit of bank blocking) but any suitable logical size can be used. In one example, a memory access contention condition is determined during runtime, such as by a memory controller or the operating system by determining that a high latency write condition will occur with respect to one or more addresses of a memory bank due to a competing memory access request to the memory bank. Logic, such as the memory controller, writes primary data from an incoming write request as well as corresponding replicated primary data (which is a copy of the primary data) to one or more different memory banks of the random access memory in response to determining the memory access contention condition. This is done in one example by the memory controller issuing one or more replicated write commands to copy the primary data into one or more different memory banks from the memory bank that was used to service the incoming write command with the primary data. When the memory bank containing the primary data is busy servicing a write request, such as to another row of memory in the bank, an incoming read request for the primary data may be serviced by reading the replicated primary data from the different memory bank of the random access memory to service the incoming read request.

In one example, the random access memory is main memory (also referred to as system memory) of the apparatus and is non-volatile random access memory. In another example, a type of lazy write operation occurs for writing the replicated primary data to different memory banks of the random access memory. For example, writing of the replicated primary data corresponding to the primary data occurs in response to determining that the different memory bank is available for the writing of the corresponding replicated primary data to a different memory bank (different from the bank used for storing the primary write data) of a random access memory. Not all data in a memory device needs to be replicated and as disclosed herein high latency write request data can be replicated, such as when read-write contention occurs corresponding to data that is needed in real time by the memory access request engine or to present a user experience where the user does not perceive delayed video or audio output presentation.

In one example, a memory controller employs a fixed mapping operation that directly mirrors at least one pair of memory banks of a random access memory address range as a primary bank with another of the pair corresponding to the replicated primary data bank. In an alternative embodiment, the memory controller employs a memory mapping table that designates at least one pair of memory banks of random access memory as a primary data bank and a corresponding replicated primary data bank as a different memory bank instead of using the same relative memory locations of different banks to store the replicated primary data.

In one example, a memory access contention condition is determined by determining a read-write contention at runtime by recording an average number of queued reads behind a bank currently performing a high latency write operation. The data is replicated into another memory bank for those memory banks determined to have a number of queued reads beyond a desired threshold.

In one example, when a write request is determined to require its data to be replicated, a plurality of different memory banks are reviewed to determine which memory bank will be ready to receive a replica of the primary data first and writes the replicated primary data to the different memory bank that is determined to be ready first. The replicated data is written to other banks that have been designated as replica banks become ready for receiving replicated data. Once all of the replicated data has been written to the one or more memory banks, the write request is retired from a command queue. This is done in one example by the memory controller issuing one or more replicated write commands to copy the primary data into the one or more different memory banks.

In one example, when a read request is received corresponding to the address of a previous write request that was replicated, the replicated primary data is read from the different memory banks of random access memory by determining whether the bank corresponding to a read address of a read request is currently busy. When the read address is busy, the plurality of different memory banks holding the replicated data are evaluated to determine which memory bank will be ready first. The replicated primary data is read from the memory bank determined to be ready first and the read data is returned to the memory access engine that issued the read request.

In another example, writing of the primary data and corresponding replicated primary data to different memory banks can be prioritized such that corresponding replicated primary data is written to different memory banks based on an amount of detected memory access contention for a given of the different memory banks such that a write bias is provided so that reads or writes of replicated primary data occur to less contended banks or the writing occurs for the replicated primary data in a round robin fashion. In another example, the writing of the replicated primary data to different memory banks is based on a type of memory technology of the different memory banks such as technology type data that can be stored in a register indicating the different memory technology types of random access memory available for storing the replicated primary data. In one example, random access memory having a technology that allows a faster write operation compared to another technology in the apparatus is designated as being a preferred random access memory for replicating write data if different RAM technologies are used.

Average read latencies can be reduced due to the increased likelihood that replicated primary data for a read request exists in an uncontended different memory bank than the bank containing the primary data (data written from original write request). If desired, a deeper queue is used to buffer replicated primary data update requests to replicated addresses since the updates are performed in a lazy fashion. However, any suitable mechanism may be employed. If desired, a memory controller can bias writes as noted above in certain ways when replicating the data. For example, if one bank is heavily contended, the memory controller can bias reads and/or writes to less contended memory banks used for storing the replicated primary data. The memory controller can also spread the load of replicating round robin between different banks of memory, if desired. The replication process can occur using memory controllers located within memories to exploit higher internal memory bandwidth and/or memory controllers connected through an off-chip interface.

FIG. 1 is a block diagram illustrating an example of an apparatus 100, employing a memory controller 102 with replicated memory based access latency reduction. The memory controller 102 writes to and reads from main memory 104. The apparatus 100 may be a home media server, smart phone, tablet, other handheld computing device, laptop computer, desktop computer, set-top box, a wearable device, Internet server, or any suitable device. Although any suitable structure may be used, in this example the apparatus 100 includes a northbridge 105, which includes memory controller 102, and southbridge 106. The northbridge 105 handles communication among, inter alia, one or more memory access engines 108, such as a CPU, GPU, APU (accelerated processing unit), controller or other memory access engine, main memory 104, and the southbridge 106. The southbridge 106 handles communication among the memory 110, such as Read-Only Memory (ROM), display(s) 112, and other peripheral devices 114, such as a touch pad, wireless or non-wireless network interface, etc. Although the memory controller 102 is shown as located within the northbridge 105, it can be integrated on the same single integrated circuit die as the memory access engine 108, located within main memory 104, located in any other suitable component, or can be a standalone integrated circuit. Similarly, main memory 104 can be integrated on the same single integrated circuit die as the memory access engine 108 or with any suitable component. Communication paths 120 interconnecting the various components in FIG. 1 are implemented using any suitable buses and protocols, such as PCI (Peripheral Component Interconnect), PCI-Express, AGP (Accelerated Graphics Port), HyperTransport, or any other bus or point-to-point communication protocol (s), and connections between different devices may use different protocols as is known in the art.

Memory access engines 108 issue memory access requests 116 such as read requests to read data from main memory 104 and issue write requests to write data to main memory 104. The memory controller 102 processes the memory access requests 116 to issue appropriate read and write commands 118 to the main memory 104.

The memory controller 102 writes primary data associated with an incoming write request and also writes corresponding replicated primary data, which is a copy of the primary data, to different memory banks of random access memory from the memory bank to which the primary data was written. This is done in one example by the memory controller replicating write commands to copy the primary data into one or more different memory banks from the memory bank that was used to service the incoming write command with the primary data. In one example, this is done in response to a determination that a memory access contention condition exists. The memory controller 102 may be implemented in any suitable manner such as a state machine, a controller that executes micro code, or any other suitable structure. The memory controller 102 replicates data corresponding to data of a write request into random access memory that can be in the form of a cache structure, main memory or other structure by way of example. The primary data which is the data associated with an incoming write request, in one example, is for a write request that results in high latency with a memory bank. In one example, a memory access latency condition is determined to occur by memory request (read and/or write) access times being measured by the memory controller 102 at runtime, for example, by recording an average delay in completing queued reads behind a memory bank that is currently busy. In one example, the memory requests as a whole are reviewed so that the latency from CPU through to each memory bank is tracked. This includes all memory controller and queueing delays as part of the decision to replicate data. This technique can be used for any memory type and not just those with high latency writes. A high latency condition may simply arise because a disproportionate number of requests are being made to one bank instead of another, so there is a high queueing delay in a read/write controller for that bank. In another example, the latency detection may be split as follows—the latency in the memory controller hardware is determined and reported to the OS. The OS then makes the replication decisions and communicates them back to the memory controller by programming replication control registers (see FIG. 4). However any suitable technique can be employed.

Such highly contended memory banks are good candidates for having their data replicated in other random access memory banks. The memory controller 102 knows which memory banks are currently performing a high latency operation based on the above detection or from notification by an OS or other source. As set forth below for example, an operating system or other mechanism can also be used to determine whether there is a memory access contention condition for access to a particular memory bank during runtime.

Figure 2:
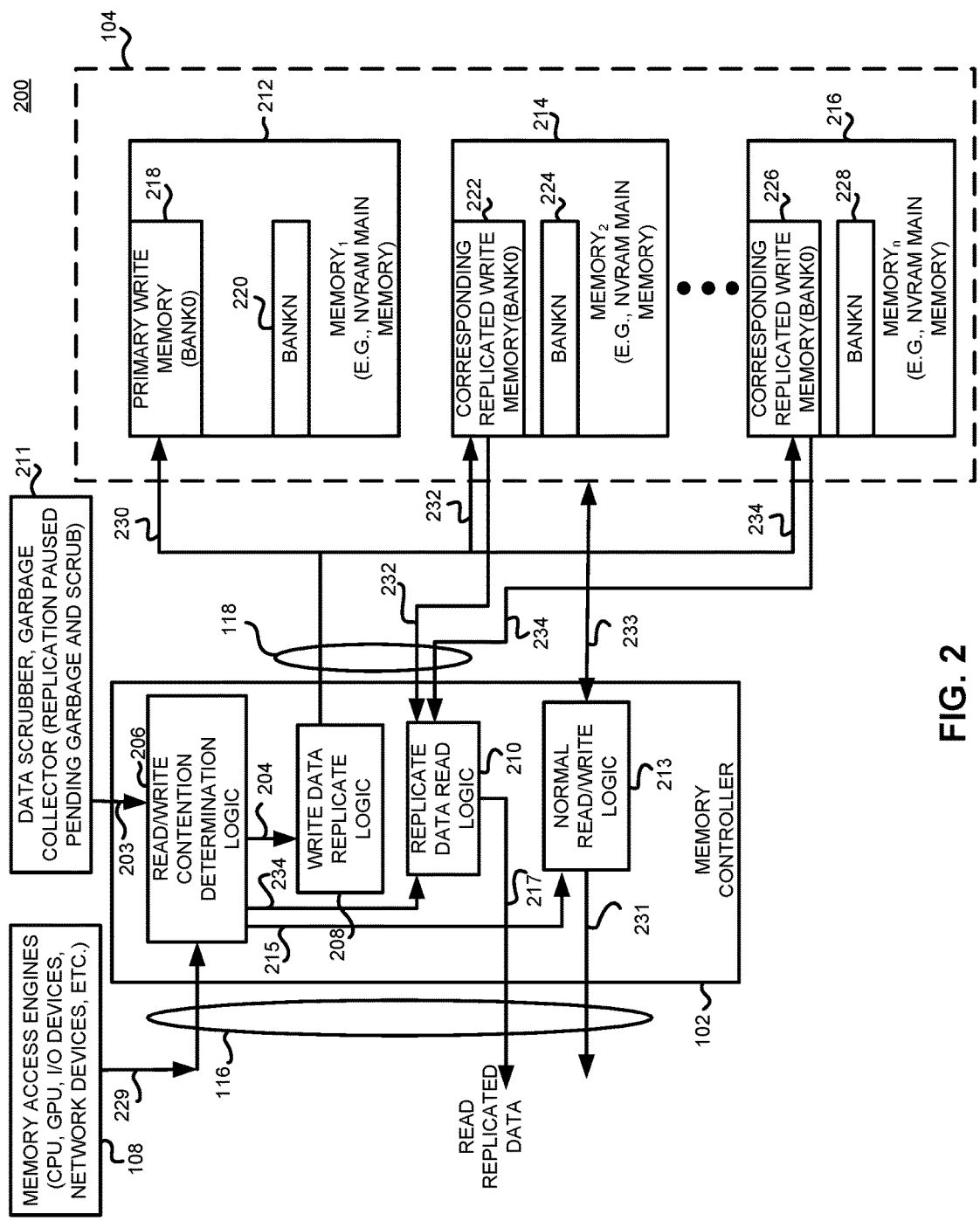
FIG. 2 is a block diagram illustrating one example of a memory controller and random access memory in accordance with the disclosure.

FIG. 2 illustrates an apparatus 200 similar to apparatus 100 that may include memory access engines 108 such as CPUs, GPUs, I/O devices, network devices or any other devices that require memory access to main memory 104 through the memory controller 102. The memory controller 102 in this example employs read/write contention determination logic 206, write data replicate logic 208, replicated read logic 210 and normal read/write logic 213. Block 211 represents garbage collectors that, for example, erase memory cells that have old data and data scrubbers that perform error correction and may also perform refreshing of memory based on flush requests, as known in the art. Block 211 issues pause information 203 (e.g., one or more bits) for use by the read/write contention determination logic 206 to pause writes or reads when data scrubbing or garbage collection operations are active. The main memory 104 includes a plurality of memories 212, 214 and 216 such as DRAM, NVRAM or other suitable RAM and in this example, is configured as main memory. Each of the memories 212-216 include a plurality of banks 218, 220, 222, 224, 226, 228. Each of the memory banks as known in the art include multiple rows of memory cells that can be read from or written to by the memory controller 102.

The read/write contention determination logic 206 determines the memory access contention condition during runtime of the apparatus 200. This may include, for example, recognizing a high latency write condition at runtime that competes with another read or write for a same memory bank. However, this may be done in any suitable manner. For example, for each incoming memory request 229, the memory controller 102 records a first timestamp. When the request is completed, the memory controller 102 records a second timestamp. For each bank, the difference between the two timestamps may be recorded as a moving average request completion latency. If the latency exceeds a specified threshold (e.g., 10% above the average latency across all banks) then a bank latency condition, also referred to as a memory access contention condition, may be indicated. When a memory access contention condition is determined, replication control data 204 is provided to the write data replicate logic 208. The replication control data 204 causes write data replicate logic 208 to not only write the data in the address designated by the write request, referred to as primary data into bank 218, but also causes the writing of corresponding replicated primary data 232 and 234 to be written to different memory banks 222 and 226 of main memory 104. In this example, the primary data is replicated twice. However, it will be recognized that a single bank for replicated primary data can be employed or more than two replication banks may be employed. The write data replicate logic 208 issues multiple writes of the same data in multiple memory banks (i.e., replicates the incoming write command for different addresses corresponding to different banks of memory). When no memory access contention condition exists, a normal write operation for the write request is carried out by issuing normal read/write control data 215 to the normal read/write logic 213. When a normal read request is processed (e.g., no read of replicated data), read data 231 is provided in a conventional manner. The arrow 233 illustrates read and write request processing without replication occurring.

In response to an incoming read request the read/write contention determination logic 206 causes replicated primary data read control information 234 to be issued for the replicated primary data read logic 210. The replicated primary data read control information 234 causes the replicated primary data read logic 210 to read the replicated primary data 232 and 234 from the different memory banks 222 and 226 to service the incoming read request and retrieve the replicated primary data. This is done when the memory bank containing the primary data 218 is busy servicing a write request such as to another row of memory in the memory bank 218. The read/write contention determination logic 206 tracks which memory banks are currently performing a high latency write operation for example, and which memory bank among memory banks is going to likely be available first for access for read or write operation. In one example a command scheduling queue (see FIG. 4) is maintained to track when each memory access is started and finishes as known in the art. Registers are updated for commands for each memory bank that is updated to track the status of each memory access being serviced by the memory controller 102. The memory controller 102 as such determines that a particular memory bank containing the primary data, in this example memory bank 218, is busy servicing an incoming read request for the primary data.

The memory controller 102 stores redundant copies of primary data in different RAM memory banks, which could be on the same chip or in different chips. In one example, initial writes only to go one RAM memory bank (though parallel writes can be carried out), and the write data (primary data) is replicated in a lazy fashion when internal or external bus bandwidth is available so that replicated primary data is written in multiple different RAM memory banks. When an incoming read request needs data, the memory banks containing the replicated primary data are accessed. If one memory bank is busy servicing a request such as a high latency write to another row in the memory bank, the other memory bank can service the read request sooner (the memory bank containing the replicated primary data). The more redundant memory banks of data, the more likely that an incoming read request can be serviced faster. In another embodiment, an incoming request to a write address that is currently pending in the memory controller can simply update the data value in a data buffer in the memory controller, including all replica writes (for a write) or return the buffered data from in the memory controller (for a read) without accessing memory, for a latency reduction.

Figure 3:
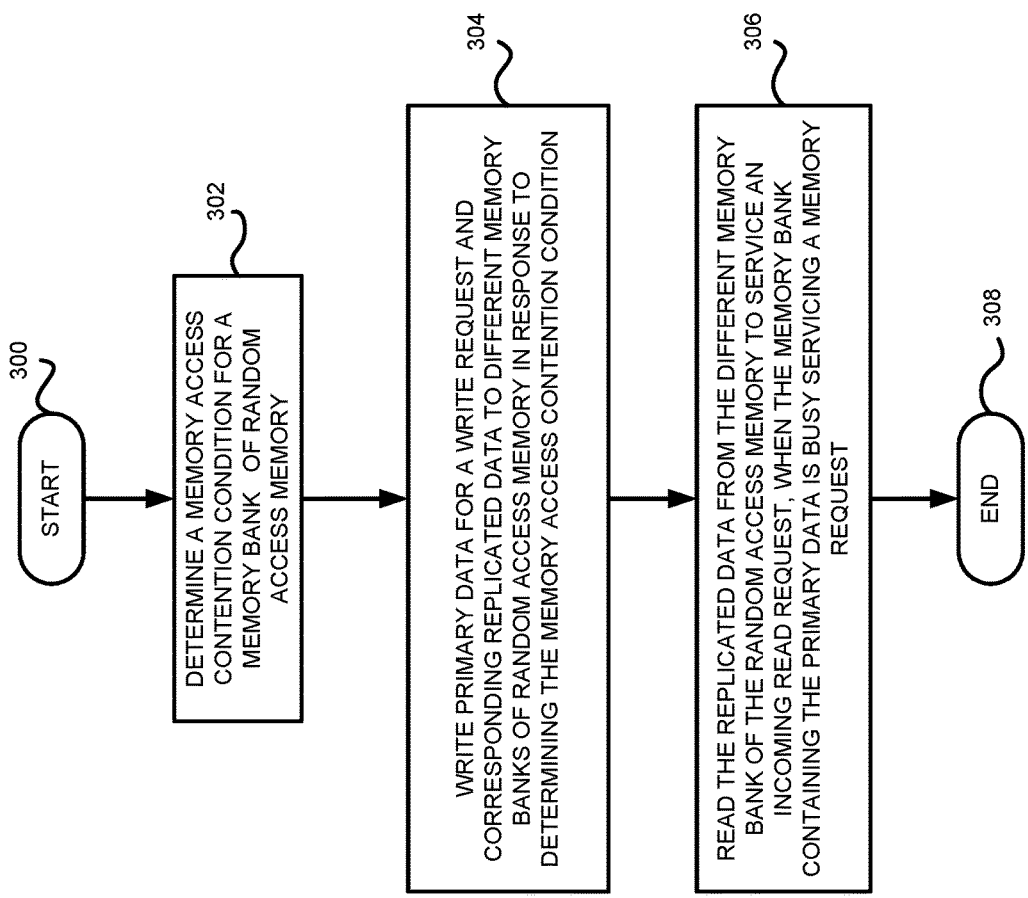
FIG. 3 is a flow chart illustrating one example of a method for reducing memory access latency in accordance with the disclosure.

Referring also to FIG. 3, a method for reducing memory access latency is illustrated and will be described with reference to FIG. 2 although any suitable structure may be employed. As shown in block 300, the method begins with a memory access engine 108 issuing a memory access request such as a write request. The method continues as shown in block 302 by determining a memory access contention condition for a memory bank of random access memory. This may be done, for example, by the memory controller 102, by a memory access engine 108 executing an operating system, such as by a CPU, or by any suitable logic. In one example this may be done by determining a read/write contention condition at runtime by recording an average number of queued read requests that are behind a memory bank currently performed a high latency write operation. In another example, determining an access latency condition at runtime is done by the OS using a history of read or write memory access requests that take more than an average period of time. For example, the OS tracks the time it takes for write requests (or read requests) to be serviced by the memory controller 102 over a period of time during runtime. An average time is recorded. When a write request takes longer than the average time, the OS determines that an access latency condition will occur for that write request based on the memory bank being accessed and issues a data replication request for that memory access request. The data replication request provides data defining one or more memory banks to use for replicating the write data. However, any other suitable approach may also be employed.

As shown in block 304, the method includes writing, such as by the memory controller 102, data for a received write request and also writing corresponding replicated primary data to different memory banks of random access memory in response to determining a memory access contention condition exists. In one example this is done by issuing one or more additional write requests within the memory controller to duplicate the data from the incoming write request from the memory access engine. As shown in block 306, in response to an incoming read request for the primary data, the method includes reading the replicated primary data from the different memory bank of the random access memory that was previously stored, to service the incoming read request when the memory bank containing the primary data, in this example memory bank 218, is busy servicing a write request to the same memory bank. As shown in the block 308, the method continues as needed for additional high latency write requests.

In one example, writing of the corresponding replicated primary data to the different memory banks of random access memory occurs after the writing of the primary data occurs. This is done in a lazy fashion such as in response to determining that the different memory bank of random access memory is available meaning that bandwidth is available in another memory bank, for writing of the corresponding replicated primary data. In one example, this is done by the memory controller 102 tracking which memory banks of the different memory banks is available first through a suitable command scheduling queue, tracking table or other mechanism. The different memory banks that are available first have the replicated primary data written to those memory banks before another memory bank is provided with replicated primary data assuming that more than one memory bank is used for the replicated primary data.

Different mechanisms may be used to associate a memory bank 218 that stores the primary write data and corresponding memory banks 222 and 226 that store replicated write data. In one example, a fixed mapping operation is employed that directly mirrors at least one pair of memory banks of random access memory as a primary memory bank and another memory bank as a replicated primary data memory bank. This makes the replication location easy to determine without implementing a mapping table. By way of example, the memory controller is configured so that anytime there is a memory bank that stores primary data, its address space, for example, in terms of rows and memory bank location within a memory 212 has the primary data copied in a same memory location in one or more different memory banks 214 in main memory 104. For example, memory bank 218 can be used for the writing of the primary data in memory 212, and memory bank 222 in memory 214 may be used to store the replicated primary data. Each memory 212, 214 and 216 has multiple memory banks therein as known in the art.

In another embodiment, a memory mapping table is employed that designates at least a pair a memory banks of random access memory as a primary data bank that stores the primary data and a corresponding replicated primary data bank that stores the replicated primary data. In this manner, addresses of memory banks are mapped together so that a mapping occurs that is more adapted to changes in memory usage of the main memory 104. The memory mapping table is maintained in one example under control of the OS. In another example the memory controller maintains the memory mapping table when the memory controller generates the replication address information (see FIG. 4).

Figure 4:
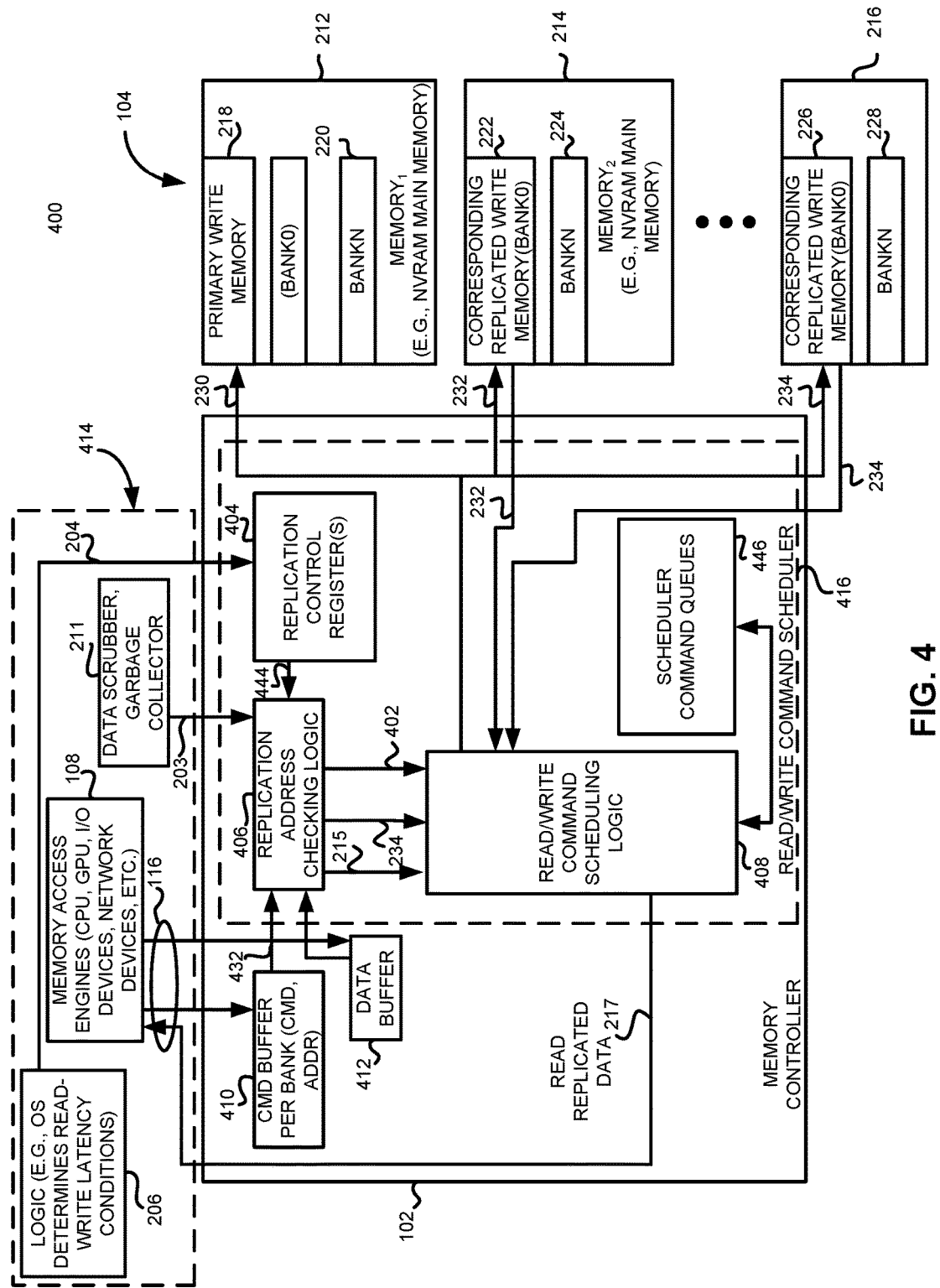
FIG. 4 is a block diagram illustrating one example of an apparatus for reducing memory access latency in accordance with the disclosure.

FIG. 4 illustrates another example of an apparatus 400 for reducing memory access latency wherein the read/write contention determination logic 206 is implemented instead by a processor executing an operating system (OS) such that the operating system determines the read/write latency conditions. The memory controller 102 includes replication control registers 404, replication address checking logic 406, read/write command scheduling logic 408, scheduler command queue 446, a command buffer per memory bank 410, and corresponding data buffer 412. The read/write command scheduling logic 408 and the scheduler command queue 446, in this example, serve as the write data replicate logic 208, the replicated primary data read logic 210 and the normal read/write logic 213. A read/write command scheduler 416 includes the blocks 404, 406, 408, and 446, and is shown in FIG. 4 by a dashed line. The read/write command scheduler 416 may be configured as one or more state machines, a microcontroller, or any other suitable logic that is operative to carry out the operations as described herein.

In this example, the OS tracks memory locations that are written back to main memory (replaced) often or that are read very often and miss in cache lookups, by way of example. As such in this example, unlike conventional operating systems, the current operating system issues write replication control data 204 such as memory location designation data that defines a memory bank or memory banks to replicate the primary data for a write request that is coming to the memory controller 102. The replication control data 204, in one example includes the range of incoming requested physical addresses to which read/write scheduling logic 408 is responsive, and for each incoming range, the address locations that are to store the replicated primary data and hence the memory banks that store the replicated primary data. Dashed box 414 represents one or more of the memory access engines 108, such as a CPU, APU or other logic, also serving as the logic 206 and block 211.

In this example, the operating system tracks the latency critical write requests from the memory access engines 108 as described above by for example determining which memory banks or addresses have latency times beyond a desired threshold. The operating system (i.e., the processor executing the OS) determines the memory locations to use for replicating primary data and provides the information as part of the replication control data 204. In operation, in response to the memory access contention condition being determined, the replication control data 204 is issued to replication control register 404 indicating, for example, which addresses to use for replication of a particular incoming write request to the memory controller. If desired, this includes the starting and ending replication addresses corresponding to the memory bank or memory banks that will serve to hold the replicated primary data corresponding to the primary write data. Populating the replication control register 404 indicates that a write request needs to be replicated such that the corresponding data is replicated in one or more different random access memory banks from the memory used to store the primary data (data from original write request).

The replication address checking logic 406 compares a write command address from the command buffer 410 shown as request 432 and compares the incoming write address to the replication addresses 444 from the replication control register 404 and if the addresses are not the same then normal operation without replication occurs such that control data 215 is issued for the read/write command scheduling logic 408. The read/write command scheduling logic 408 then treats the incoming write request in a normal fashion and writes data in a memory bank without replication. In other words no data replication is carried out.

However, if the address is the same, then the replication address checking logic 406 issues a replication command 402 to the read/write command scheduling logic 408. The replication command 402 may include the address information of the replication addresses 444 indicating which addresses and hence which banks are to be used for the replication of the write data. The replication address checking logic 406 issues the replication command 402 to the read/write command scheduling logic 408 to cause replication of the write data into one or more different memory banks. The read/write command scheduling logic 408 schedules one or more writes of the primary data to different memory banks using the addresses received from the replication control data 204. The OS uses multiple memory banks for replication if a user sets the number through a graphic user interface, for example, or the OS uses multiple banks for those writes determined to have an access latency above a desired threshold. However any suitable technique may be employed.

In the case of an incoming read request, the replication address checking logic 406 compares the incoming read request to the address ranges designated for replication. The replication address checking logic 406 compares the read request address to the write address ranges that have been replicated. The replication address checking logic 406 determines which of the one or more different banks containing the replicated primary data is available to service the incoming read request and issues the replicated read control data 234 to the read/write scheduling logic 408 to read from the corresponding different memory bank as previously described.

As noted above, the replication control data 204 in one example, is the result of a lookup in a mapping table or in another example, is fixed based on a mirroring configuration. The scheduling command queue 446 holds, on a per memory bank basis, the sequence of scheduled memory commands including the current command being executed for the various memory banks. Replicated writes to different banks exist as memory write commands in two or more of the memory bank command queues. For write commands, the data to be written is replicated in each of the per-bank queues. A read request is serviced from any of the replicated write locations that are ready to service the read request. The data scrubber or garbage collector block 211 performs conventional data scrubbing and garbage collecting as to the data in memory and issues a replication pause signal 203 to the replication address checking logic 406 during periods of data scrubbing and garbage collection to avoid writing or reading conflicts during such operations.

Figure 5:
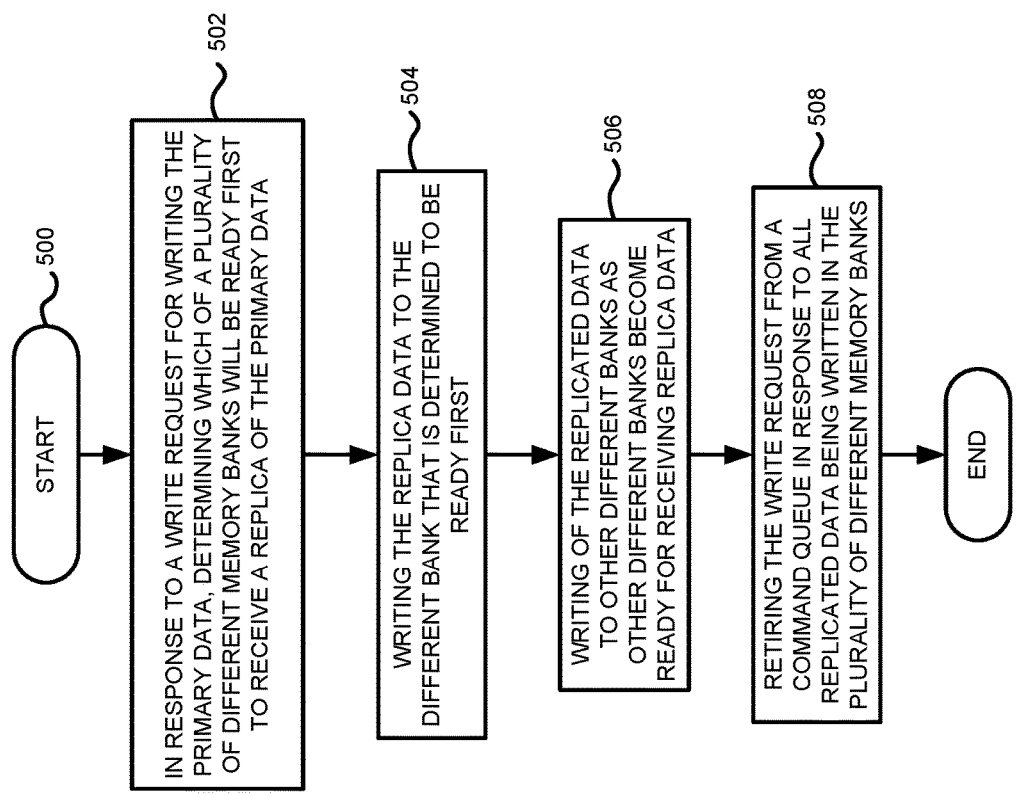
FIG. 5 is a flow chart illustrating one example of a method for reducing memory access latency in accordance with the disclosure.

FIG. 5 illustrates one example of a method for reducing memory access latency from a write request processing perspective. As shown in block 500, the method beings, for example, after it is determined that a replication operation should occur such that a memory access contention condition exists during runtime. This can be done, for example, as described above by the memory controller 102 or by logic 206 determining a read/write contention at runtime by recording an average number of queued reads being a memory bank currently performing a high latency write operation or via the other techniques set forth above. For those memory banks determined to have a number of queue reads or historical average latency beyond a desired threshold, they are designated as memory banks that require the replicating of write data to other memory banks.

As shown in block 502, the method includes in response to a write request for writing the primary data, determining which of the different memory banks 222 or 226 would be ready first to receive a replica of the primary data 230. Blocks 502-508 are carried out, in this example by the read/write command scheduling logic 408 but may be carried out by any suitable logic including outside of the memory controller.

As shown in block 504, the method includes writing the replicated primary data 232 or 234 which serves as a coherent copy of the primary data 230, to the different memory bank that is determined to be ready first. As such, read/write command scheduling logic 408 schedules writes to the corresponding replication memory bank 222 or 226 by way of example. Stated another way, the incoming write command is replicated as additional writes to the different memory banks to store a copy of the primary data in each of the memory banks 222 and/or 226.

As shown in block 506, where multiple copies are desired, the method includes writing the replicated primary data, in a lazy fashion, to other different banks as other different banks become ready for receiving replicated primary data. In this example, this is carried out by the write command scheduling logic 408 writing to additional memory banks 222 and/or 226 depending upon the number of memory banks being used to replicate the primary data 230. The number of memory banks being used for replicated primary data is designated by the data in the replication control register 404 or in any other suitable manner. A second (redundant) write of the data can be performed in a low-priority ("lazy") fashion in order to handle other more important requests like read requests. In one example, the memory controller 102 uses a defer queue in the scheduling queues to buffer replicated write requests for replicating primary data, such as described for example in U.S. Patent Application Publication No. 2015/0095605, U.S. patent application Ser. No. 14/044,454 entitled LATENCY-AWARE MEMORY CONTROL, having inventors Roberts et al., filed Oct. 2, 2013, owned by instant assignee and incorporated herein by reference. Any techniques can be used including tracking which addresses are available first of the address used to replicate the data by using the scheduling queues to see which replicated write requests can be written first. As shown in block 508, the method includes retiring the write request from the command queue 446, in response to all replicated primary data being written in the plurality of different memory banks.

Figure 6:
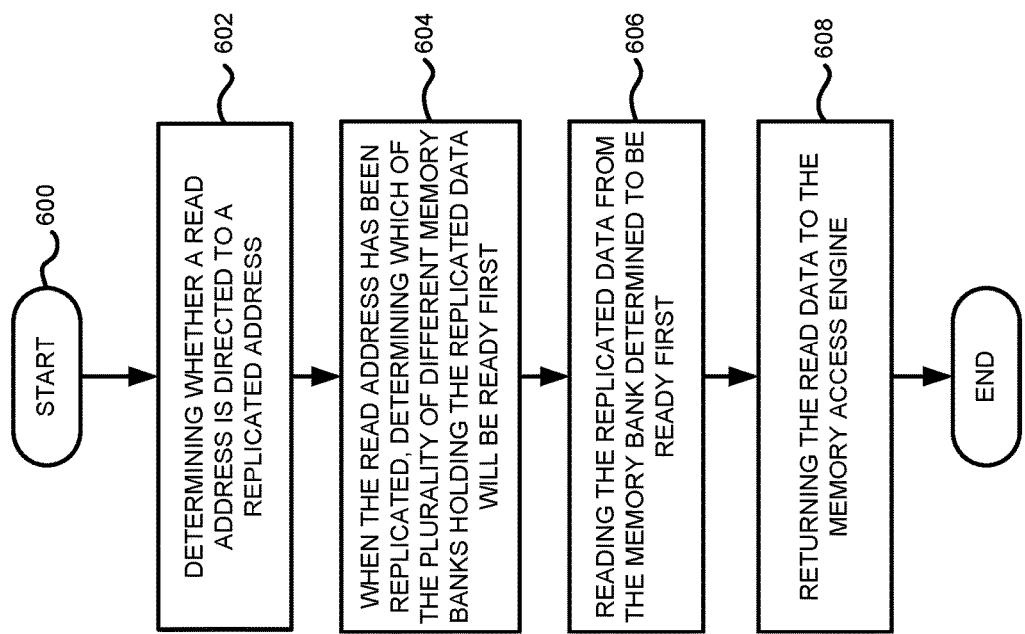
FIG. 6 is a flow chart illustrating one example of a method for reducing memory access latency in accordance with the disclosure.

FIG. 6 illustrates a method for reducing memory latency from the perspective of processing an incoming read request. As shown in block 600, the method begins by the replication address checking logic 406 obtaining the read request from the command buffer 410. As shown in block 602, the replication address checking logic 406 determines whether a read address of the read request is directed to a replicated address by referencing replication control registers 404. As shown in block 604, the method includes when the read address from the read request has been replicated due to a previous write request being replicated, determining which of the plurality of different memory banks holding the replicated primary data will be ready first. This is done, in one example by the read/write command scheduling logic 408. This information can be in the scheduling queue 446 which tracks when a memory bank is available. The read/write command scheduling logic 408 knows which memory banks contain the replicated primary data for the given address by observing data from address checking logic 406 indicating which banks contain replicated primary data. As shown in block 606, the method includes reading the replicated primary data from the memory bank determined to be ready first which is controlled by the read/write command scheduling logic 408. As shown in block 608, the method includes returning the replicated read data 217 to the memory access engine 108. This is done, in one example by the read/write command scheduling logic 408. In the case of FIG. 2, this is performed by the replicated primary data read logic 210 passing the read replicated read data 217 to the memory access engine 108 that issued the read request.

As described above, the writing of corresponding replicated primary data to different memory banks can be based on an amount of detected memory access contended for a given memory bank for example by identifying certain memory banks that have high contention rates. Alternatively, a type of memory technology of a different memory bank may also be employed such as the apparatus 200 or 400 storing memory technology type data indicating the type of memory technology employed in the various memories 212, 214 and 216. This is stored in a lookup table, register or in any other form and accessed by the logic 206 or the memory controller as needed to determine whether a preference should be provided, for example, to a memory that has a faster write access or read access capability because of its technology type.

Also, any suitable mechanism can be used for tracking when duplicated memory banks have completed their writes or reads, such as flags or any other suitable mechanism. When writing the replicated primary data, the writing can occur in a lazy fashion such as later in time than the primary data being written as the different memory banks become available for the writing operation.

As noted above, queueing delays for heavily accessed banks for either reads or writes can cause high latency. By providing more choices of memory access location through replicated primary data as described above, latency can be improved. In one example, if the address range that a read request is accessing is currently replicated, as specified in replication control registers 404, the memory controller can check the scheduler command queues 446 for the most recent pending write command. If there is a pending write, data can be forwarded immediately to the read without going to memory. This immediate forward mechanism is a standard technique. If there is no pending write to that address, the memory controller knows where all the replicas of the primary data are so the memory controller can choose to put the read command in the queue for the memory bank which will be ready soonest.

The above detailed description and the examples described therein have been presented for the purposes of illustration and description only and not for limitation. For example, the operations described may be done in any suitable manner. Also, an apparatus includes any suitable product which includes for example an integrated circuit that includes the memory controller 122 and main memory 104 or any suitable combination of components. It is therefore contemplated that the present embodiments cover any and all modifications, variations or equivalents that fall within the scope of the basic underlying principles disclosed above and claimed herein. Furthermore, while the above description describes hardware in the form of a processor executing code, hardware in the form of a state machine or dedicated logic capable of producing the same effect, other structures are also contemplated.

What is claimed is:

1. A method for reducing memory access latency, comprising:

determining, by logic in a device during runtime of the device, a memory access contention condition of random access memory;

writing by a memory controller in the device, primary data to a first memory bank of the random access memory and corresponding replicated primary data to a second memory bank of the random access memory in response to the determination of the memory access contention condition; and wherein writing the primary data to the first memory bank includes writing primary data from a high latency write request to the first memory bank and replicating the data from the high latency write request to the second memory bank and wherein the random access memory is main memory of the device.

2. The method of claim 1, further comprising:

in response to an incoming read request for the primary data, reading the replicated primary data from the second memory bank to service the incoming read request, when the first memory bank is busy servicing a write request.

3. The method of claim 2, wherein reading the replicated primary data from the second memory bank of the random access memory comprises:
determining whether a read address of the read request is directed to a replicated address corresponding to the second memory bank;
when the read address has been replicated, determining which of the plurality of different memory banks holding the replicated primary data will be ready first;
reading the replicated primary data from the different memory bank determined to be ready first; and
returning the read data to the memory access requestor.

4. The method of claim 1, further comprising:
writing the corresponding replicated primary data to the second memory bank of random access memory after the writing of primary data occurs and in response to determining that the second memory bank of the random access memory is available for the writing of the corresponding replicated primary data to the second memory bank of random access memory.

5. The method of claim 1, further comprising:
employing, by the memory controller, a fixed mapping operation that directly mirrors at least one pair of memory banks of random access memory as a primary data bank with a corresponding replicated primary data bank as the second memory bank of the random access memory.

6. The method of claim 1, further comprising:
employing a memory mapping table that designates at least one pair of memory banks of random access memory as a primary data bank and corresponding replicated primary data bank as the second memory bank of the random access memory.

7. The method of claim 1, wherein:
determining, by the logic, the memory access contention condition for memory access logic corresponding to a memory bank of random access memory comprises determining a read-write contention at runtime by recording an average number of queued reads behind a bank currently performing a high latency write operation; and
the method includes replicating the primary data, by the memory controller into another memory bank for those memory banks determined to have a number of queued reads beyond a desired threshold.

8. The method of claim 1, wherein writing, by the memory controller, primary data to the first memory bank of the random access memory and corresponding replicated primary data to the second memory bank of the random access memory in response to determining the memory access contention condition comprises:
in response to a write request for writing the primary data, determining which of a plurality of different memory banks will be ready first to receive a replica of the primary data;
writing the replica of the primary data to the different memory bank that is determined to be ready first;
writing of the replica of primary data to other different memory banks as other different memory banks become ready for receiving replica data; and
retiring the write request from a command queue in response to all replicas of the primary data being written in the plurality of different memory banks.

9. The method of claim 1, wherein writing, by the memory controller, primary data to the first memory bank of the random access memory and corresponding replicated primary data to the second memory bank of the random access memory in response to determining the memory access contention condition comprises prioritizing the writing of corresponding replicated primary data to second memory banks based on at least one of:
an amount of detected memory access contention for a given different memory bank; and
a type of memory technology of the different memory banks of the random access memory.

10. An apparatus for reducing memory access latency, comprising:
a plurality of memory banks of non-volatile random access memory (NVRAM); and
a memory controller, operatively coupled to the plurality of memory banks of NVRAM, operative to:
determine a memory access contention condition of the plurality of memory banks of (NVRAM) during runtime;
write primary data to a first memory bank of the random access memory and corresponding replicated primary data to a second memory bank of the plurality of banks of NVRAM in response to determining the memory access contention condition, and
wherein writing the primary data to the first memory bank includes writing primary data from a high latency write request to the first memory bank and replicating the data from the high latency write request to the second memory bank and wherein the random access memory is main memory of the device.

11. The apparatus of claim 10, wherein the memory controller, in response to an incoming read request for the primary data, is operative to read the replicated primary data from the second memory bank of the NVRAM to service the incoming read request, when the memory bank containing the primary data is busy servicing a write request.

12. The apparatus of claim 11, wherein reading the replicated primary data from the second memory bank of the NVRAM by the memory controller comprises:
determining whether a read address of the read request is directed to a replicated address of the second memory bank;
when the read address has been replicated, determining which of the plurality of different memory banks holding the replicated primary data will be ready first;
reading the replicated primary data from the different memory bank determined to be ready first; and
returning the read data to the memory access requestor.

13. The apparatus of claim 10, wherein the memory controller is operative to write the corresponding replicated primary data to the second memory bank of NVRAM after the writing of primary data occurs and in response to determining that the second memory bank of the NVRAM is available for the writing of the corresponding replicated primary data to the second memory bank of NVRAM.

14. The apparatus of claim 10, wherein the memory controller is operative to employ a fixed mapping operation that directly mirrors at least one pair of memory banks of NVRAM as a primary data bank with a corresponding replicated primary data bank as the second memory bank of the NVRAM.

15. The apparatus of claim 10, wherein the memory controller is operative to employ a memory mapping table that designates at least one pair of memory banks of NVRAM as a primary data bank and corresponding replicated primary data bank as the second memory bank of the NVRAM.

16. The apparatus of claim 10, wherein determining, by the memory controller, the memory access contention condition for memory access logic corresponding to a memory bank of random access memory comprises determining a read-write contention at runtime by recording an average number of queued reads behind a bank currently performing a high latency write operation and replicating primary data into another memory bank for those memory banks determined to have a number of queued reads beyond a desired threshold.

17. The apparatus of claim 10, wherein writing, by the memory controller, primary data to the first memory bank of the random access memory and corresponding replicated primary data to the second memory bank of the random access memory in response to determining the memory access contention condition comprises:
   in response to a write request for writing the primary data, determining which of a plurality of different memory banks will be ready first to receive a replica of the primary data;
   writing the replica of the primary data to the different memory bank that is determined to be ready first;
   writing of the replica of the primary data to other different memory banks as other different memory banks become ready for receiving replica data; and
   retiring the write request from a command queue in response to all replicas of the primary data being written in the plurality of different memory banks.

18. The apparatus of claim 10, wherein writing, by the memory controller, primary data to the first memory bank of the random access memory and corresponding replicated primary data to the second memory bank of the NVRAM in response to determining the memory access contention condition comprises prioritizing the writing of corresponding replicated primary data to second memory banks based on at least one of:
   an amount of detected memory access contention for a given different memory bank; and
   a type of memory technology of the second memory banks of the random access memory.

19. The apparatus of claim 10, further comprising at least one memory access engine operatively coupled to the memory controller and operative to issue memory write requests and read requests to the memory controller and comprising main memory comprised of the plurality of memory banks of non-volatile random access memory (NVRAM).

20. An apparatus for reducing memory access latency, comprising:
   a plurality of memory banks of non-volatile random access memory (NVRAM);
   logic operative to:
      determine a memory access contention condition of the plurality of memory banks of NVRAM during runtime; and
      issue read and write requests; and
   a memory controller, operatively coupled to the plurality of memory banks of NVRAM and to the logic, and operative to write primary data to a first memory bank of the random access memory and corresponding replicated primary data to a second memory bank of the plurality of banks of the NVRAM in response to determining the memory access contention condition, wherein writing the primary data to the first memory bank includes writing primary data from a high latency write request to the first memory bank and replicating the data from the high latency write request to the second memory bank and wherein the random access memory is main memory of the device.

21. The apparatus of claim 20, wherein:
the logic comprises at least one processor;
the plurality of memory banks of NVRAM are configured as main memory for the at least one processor; and
the memory controller, in response to an incoming read request for the primary data is operative to read the replicated primary data from the second memory bank of the NVRAM to service the incoming read request, when the memory bank containing the primary data is busy servicing a write request.

* * * * *